United States Patent [19]

Altoz et al.

[11] 4,171,859
[45] Oct. 23, 1979

[54] SLIDING AIR SEAL FOR ELECTRONIC ASSEMBLIES

[75] Inventors: Frank E. Altoz, Catonsville; Alfred A. Zucchi, Severna Park; Roald N. Horton, Ellicott City, all of Md.

[73] Assignee: The United States of America as represented by the Secretary of the Air Force, Washington, D.C.

[21] Appl. No.: 880,750

[22] Filed: Feb. 23, 1978

[51] Int. Cl.² .............................................. H01R 13/00
[52] U.S. Cl. .............................. 339/112 R; 174/16 R; 339/17 R
[58] Field of Search .................... 339/112 R, 15, 16 R, 339/17 R, 17 M, 17 LM, 94 R, 94 A, 94 M, 117 R; 174/16 R

[56] References Cited

U.S. PATENT DOCUMENTS

| | | | |
|---|---|---|---|
| 3,853,475 | 12/1974 | Gordon et al. | 23/252 R |
| 3,917,370 | 11/1975 | Thornton et al. | 339/16 R |
| 3,925,710 | 12/1975 | Ebert | 174/16 R X |
| 4,006,388 | 2/1977 | Bartholomew | 174/16 R X |

*Primary Examiner*—Roy Lake
*Assistant Examiner*—DeWalden W. Jones
*Attorney, Agent, or Firm*—Joseph E. Rusz; Arsen Tashjian

[57] ABSTRACT

A wedge-shaped printed wiring assembly is inserted into a chassis having guide rails for coarse positioning of the unit the final alignment being accomplished with male and female pins on the connector. Slotted air openings at the entrance and exit of the printed wiring assembly are matched to corresponding openings through the seal. The seal surfaces are tapered a nominal 1.5 degrees top to bottom to facilitate insertion of the printed wiring assembly into the chassis which causes the taper surfaces to come together and force the seal to deflect uniformly and provide a tight interface across the entire surface. The seal material is preferably polyether urethane or a like material.

6 Claims, 7 Drawing Figures

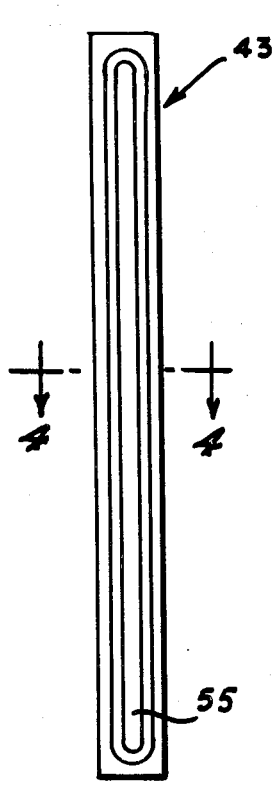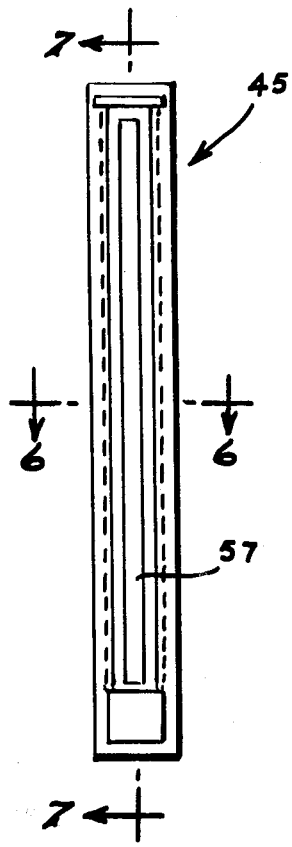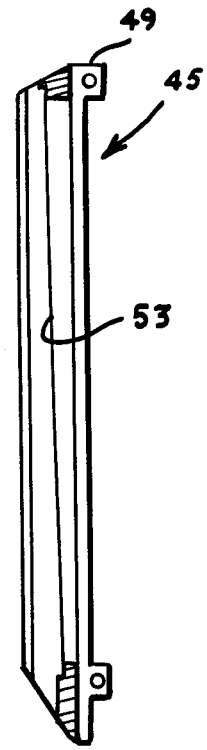
FIG.3  FIG.5  FIG.7
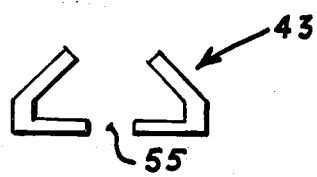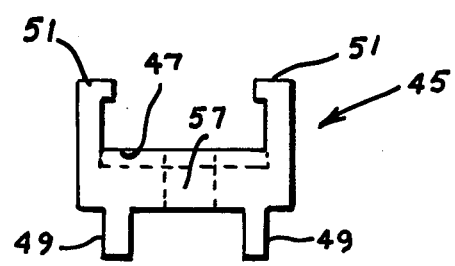
FIG.4  FIG.6

SLIDING AIR SEAL FOR ELECTRONIC ASSEMBLIES

STATEMENT OF GOVERNMENT INTEREST

The invention described herein may be manufactured and used by or for the Government for governmental purposes without the payment of any royalty thereon.

BACKGROUND OF THE INVENTION

This invention relates to a system for air cooling integrated circuits and the like and, more particularly, the invention is concerned with providing a co-planar cooling system for cooling integrated circuits of the dual-in-line and flat pack variety wherein a sliding seal arrangement permits maximum opening size at inlet and outlet resulting in minimum pressure drop accomplished by providing a pressure seal across a slotted opening in a direction normal to the engagement.

The air cooling of integrated circuits of the dual-in-line and flat pack variety generally fall into two categories, in-line conduction and co-planar. The co-planar method of cooling is where the air passes as close as possible to the junction of the device resulting in the lowest operating temperature. It has been found that temperature improvements of 15° to 20° C. are obtainable by the co-planar approach versus the in-line conduction method. These comparisons are based on equal pressure drops and air flow rates.

Certain problems arise during the implementation of the co-planar method of cooling particularly as it relates to the inlet and exit sealing of the cooling air into a printed wiring assembly. The present technique shown in FIG. 1, utilizes a direct compression seal at the inlet and exit. Each opening is sized in one direction to be compatible with the 0.4 to 0.5 inch center to center printed wiring assembly spacing and in the other direction is limited by allowable printed wiring assembly board length within the total package. These type seals are commonly employed in the art and provide satisfactory sealing characteristics. However, from a pressure standpoint the configuration is limiting. The entering air, in traversing a path through the printed wiring assembly of FIG. 1 must twice change direction and, in addition, is forced to pass through two small openings at the entrance and exit which adds to the total pressure required to pass through the printed wiring assembly proper. These losses often account for 30 to 50 percent of the total through the unit from inlet to outlet and represents an intolerable penalty particularly where available pressure is at a premium.

In a typical electronic assembly cooling system, the total pressure available through the printed wire assembly is only 1.0 inch of water so that even a small allowance for air distribution losses places a severe penalty on heat transfer effectiveness for cooling. The hereinafter described invention overcomes the aforementioned difficulties by greatly reducing the losses due to inlet and exit conditions resulting in maximum available pressure for heat transfer to the integrated circuit packages.

SUMMARY OF THE INVENTION

The present invention is concerned with providing a sealing arrangement for electronic assemblies wherein a unique sliding surface seal accomplishes an air pressure seal across a slotted opening in a direction normal to the engagement. The integrity of the seal is maintained with a minimum pressure drop across its interface thereby assuring a maximum pressure for use in the heat transfer process leading to a lowering of integrated circuit temperatures.

Accordingly, it is an object of the invention to provide a sliding air seal for electronic assemblies wherein maximum opening sizes at the air inlet and outlet operate to reduce the pressure drop to a minimum.

Another object of the invention is to provide a sliding air seal for a printed wiring assembly wherein a controlled engagement surface between the printed wiring assembly and the chassis causes the contact to begin near the end of the printed wiring assembly insertion travel distance.

Still another object of the invention is to provide a sliding air seal for a wedge shaped electronic assembly wherein a low insertion and removal force is consistent with maintenance requirements.

A further object of the invention is to provide a sliding air seal for printed wiring assemblies wherein a leak-tight seal provides true separation of air and components as required by strict military standards.

A still further object of the invention is to provide a sliding air seal for a wedge shaped electronic assembly wherein unique sliding surfaces produce pressure seals across slotted openings in a direction normal to the engagement.

Another still further object of the invention is to provide a sliding air seal for electronic assemblies wherein the seal material is polyether urethane to provide excellent sliding characteristics as well as the necessary air seal at low pressure differentials.

These and other objects, features and advantages will become more apparent after considering the following detailed description taken in conjunction with the annexed drawings and appended claims.

BRIEF DESCRIPTION OF THE DRAWINGS

FIG. 3 is a front view of the resilient seal member which operates to prevent air from escaping around the inlet and exit;

FIG. 4 is a cross-sectional view of the seal of FIG. 3 taken along the line 4—4;

FIG. 5 is a plan view of the end cap which is fixedly attached to each side of the wedge-shaped printed wiring assembly for engagement with guide rails on the chassis;

FIG. 6 is a cross-sectional view of the end cap of FIG. 5 taken along the line 6—6; and FIG. 7 is a view in longitudinal cross-section taken along the line 7—7 of FIG. 5.

DESCRIPTION OF A PREFERRED EMBODIMENT

Figure 1:
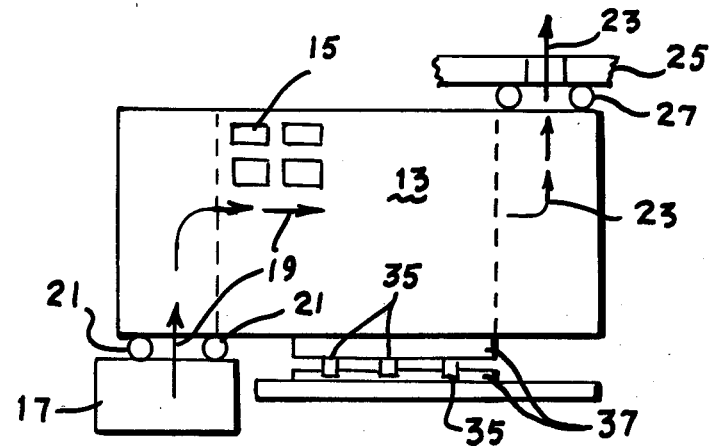
FIG. 1 is a side view which schematically depicts the prior art technique for cooling by co-planar means showing the direct compression seal at the inlet and exit.

Referring now to the drawings wherein like reference numerals refer to comparable elements in the several views, in FIG. 1 there is schematically illustrated the present technique for air cooling a printed wiring assembly 13 which includes a plurality of integrated circuits 15 therein. In the prior art cooling system shown in FIG. 1, cooling air enters at the lower left corner of the printed wiring assembly 13 from the air plenum 17 and follows the direction of the arrows 19 making a right angle turn to enter the area of the integrated circuits 15. A direct compression seal 21 is located at the inlet between the air plenum 17 and the printed wiring assembly 13. A similar arrangement in the upper right corner of the printed wiring assembly 13 allows the exiting air following the direction of the arrows 23 to exit through the cover 25 which is provided with a compression seal 27 to prevent air leakage. The inlet and exit openings are sized in one direction to be compatible with the electronic assembly center to center spacing and in the other direction is limited by the allowable length of the printed wiring assembly within the total package. It can be seen that the entering and exiting air 19 and 23 in traversing a path through the printed wiring assembly of FIG. 1 must twice change direction and in addition is forced to pass through the small openings at the entrance and exit which adds to the total pressure required to pass through the printed wiring assembly proper. These losses can account for 30 to 50% of the total pressure through the unit from inlet to outlet and appreciably reduces the heat transfer effectiveness of the cooling system as well as reducing the maximum available pressure to a dangerously low level.

Figure 2:
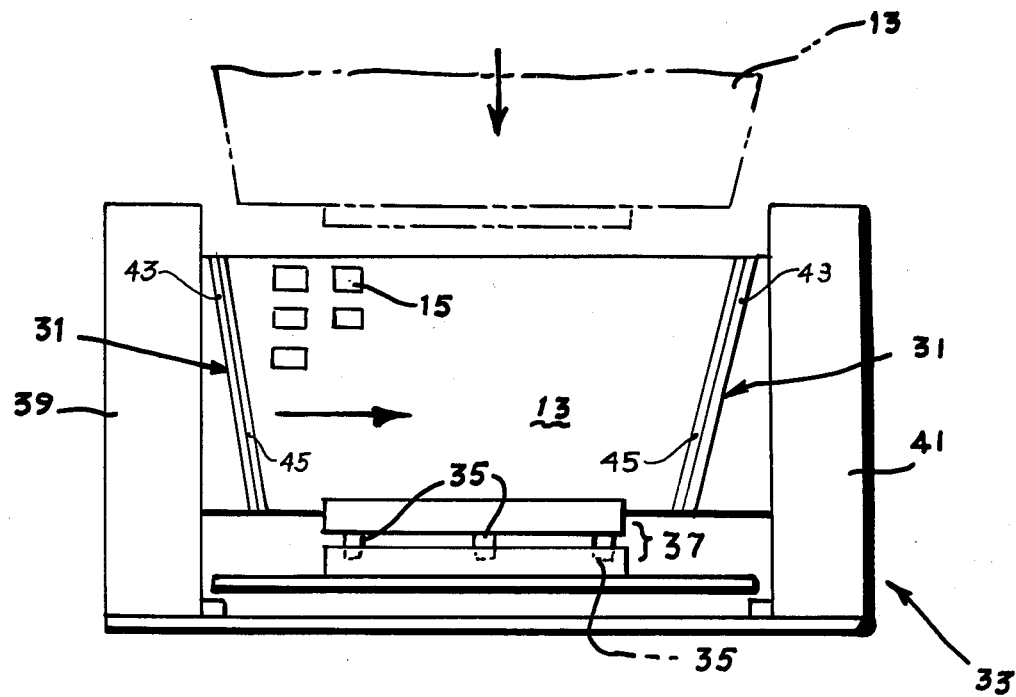
FIG. 2 is a side view in schematic showing the co-planar cooling of a printed wiring assembly of wedge shaped configuration according to the invention wherein the cooling air passes close to the junction with a minimum pressure drop.

In FIG. 2, there is shown a schematic view of a cooling system assembly which includes a sliding seal configuration 31 according to the invention. The printed wiring assembly 13 is inserted into the chassis 33 which includes guide rails (not shown) for coarse positioning of the unit. Final alignment is accomplished with male and female pins 35 on the connector 37 which also serves to accept only the proper printed wiring assembly through orientation of the engagement pins 35. The air opening through the inlet air plenum 39 is matched to the seal 31 for minimum pressure drop. Likewise, the outlet air plenum 41 is matched to the seal 31. The seal surfaces are tapered a nominal 1.5° top to bottom which permits a gradual engagement of the printed wiring assembly near the end of its travel.

Upon insertion of the unit 13, the taper surfaces come together and force the seal 31 to deflect uniformly providing a tight interface across the entire surface. Deflection is controlled dimensionally to 0.06 inch for the seal member 43 shown in FIGS. 3 and 4. The seal member 43 is made an integral part of the end cap 45 shown in FIGS. 5, 6 and 7 by bonding it to the surface 47. The end cap 45 includes side protrusions 49 for attachment of the assembly 13 which includes the integrated circuits 15 and the heat transfer surface for cooling. The protrusions 51 on the opposite side of the end cap 45 act as guides for insertion of the assembly 13 into the chassis package 33. Each of the end caps 45 is provided with a taper surface 53 which engages a matching identical taper on each of the plenums 39 and 41. During operation of the cooling system, the cooling air passes through the opening 55 in the seal 43 and the opening 57 in the end cap 45.

The material of the seal 43 is preferably polyether urethane which has excellent sliding abrasion characteristics as well as providing the necessary air seal at low pressure differentials. Polyether urethane is available commercially from the Mobay Chemical Corporation as Texin 985A. Other materials having similar physical properties could be used for the seal 43.

Although the invention has been illustrated in the accompanying drawings and described in the foregoing specification in terms of a preferred embodiment thereof, the invention is not limited to this embodiment or to the preferred configuration shown. It will be apparent to those skilled in the art that our invention could have extensive use in other operations where it is necessary to provide a suitable cooling system for electronic assemblies which are of wedge shaped configuration. By providing slotted openings on the slanted sides of the assembly, the air is allowed to circulate without turning sharp corners and without any appreciable drop in pressure while at the same time allowing a snug fit in the chassis.

Having thus set forth the nature of our invention, what we claim and desire to secure by Letters Patent of the United States is:

1. A system for air cooling an electronic assembly and the like, comprising a wedge-shaped printed wiring assembly having top to bottom tapered sides, slotted openings along the vertical length of each of the tapered sides of said printed wiring assembly, a chassis having correspondingly tapered sides for receiving said printed wiring assembly, slotted openings along the vertical length of each tapered side of said chassis in alignment with the slotted openings in said printed wiring assembly, an air plenum positioned on each side of said chassis and operatively connected to said printed wiring assembly for supplying and withdrawing the cooling air thereto and therefrom through said slotted openings, and sealing means positioned around each of said slotted openings between said printed wiring assembly and the tapered sides of said chassis thereby allowing the cooling air to pass substantially unrestricted through said printed wiring assembly without any appreciable pressure loss and leakage.

2. The system for air cooling an electronic assembly defined in claim 1 wherein said sealing means includes an end cap attached to said printed wiring assembly around each of the slotted openings therein and a sliding air seal positioned in said end cap and pressing against the outer edges of the aligned slotted openings in the chassis thereby providing a tight interface between the chassis and the printed wiring assembly after insertion therein.

3. The system for air cooling an electronic assembly defined in claim 2 wherein said chassis includes guide rails around each of the slotted openings therein for engaging the end caps attached to said printed wiring assembly thereby providing for coarse positioning of the assembly in the chassis.

4. The system for air cooling an electronic assembly defined in claim 2 wherein said end cap includes a tapered surface of 1.5 degrees top to bottom, said sliding air seal being fixedly attached to said tapered surface thereby facilitating the insertion of the printed wiring assembly into the chassis.

5. The system for air cooling an electronic assembly defined in claim 2 wherein said sliding air seal is fabricated of a resilient material.

6. The system for air cooling an electronic assembly defined in claim 2 wherein said sliding air seal is fabricated of polyether urethane.

* * * * *